United States Patent [19]

Bacich

[11] Patent Number: 4,733,945
[45] Date of Patent: Mar. 29, 1988

[54] PRECISION LENS MOUNTING

[75] Inventor: John J. Bacich, Brookfield, Conn.

[73] Assignee: The Perkin-Elmer Corporation, Norwalk, Conn.

[21] Appl. No.: 818,925

[22] Filed: Jan. 15, 1986

[51] Int. Cl.⁴ .................................................. G02B 7/02
[52] U.S. Cl. ................................... 350/253; 350/252; 354/286
[58] Field of Search ............... 350/253, 252, 255, 247, 350/245, 254; 354/286

[56] References Cited

U.S. PATENT DOCUMENTS 4,046,458 9/1977 Smulders et al. ................... 350/252
4,239,364 12/1980 Doi .................................... 350/252

Primary Examiner—John K. Corbin
Assistant Examiner—Loha Ben
Attorney, Agent, or Firm—Thomas P. Murphy; Edwin T. Grimes; Francis L. Masselle

[57] ABSTRACT

A precision lens mounting assembly which includes a plurality of lens cells and a plurality of lenses which correspond to the plurality of lens cells. The lens cells have an annular shape. Flexure means are disposed within the inner diameter of the lens cell which hold the lens in a predetermined spatial relation at a datum temperature to the lens cell. The flexure means return the lenses to this predetermined spatial relation following temperature excursions away from, then back to, the datum temperature. The outer diameter of the lens cells in the assembly are all substantially equal and substantially concentric about the optical axis of the lenses they hold. The upper and lower surfaces of the lens cell each have three or more precision surfaces disposed on a plane. The plane are perpendicular to the optical axis of the lens and have a predetermined spatial relation to the apex of the lens. Selected ones of the lens cells can be rotated, translated or moved axially with respect to the other lens cells in the lens assembly to correct for astigmatism, coma or spherical aberrations, respectively. Adhesive means are provided to hold the plurality of the lens cells together.

27 Claims, 22 Drawing Figures

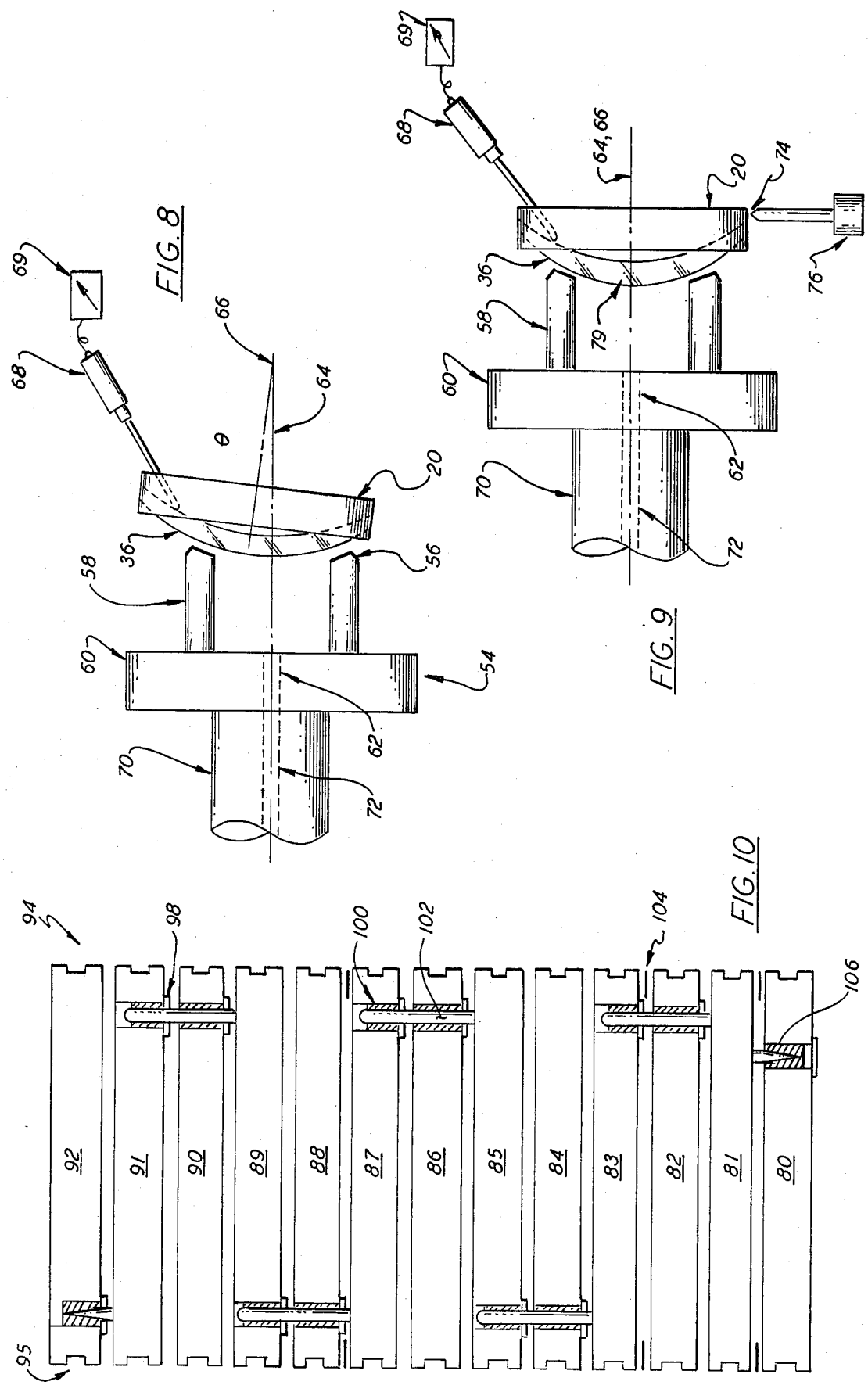

PRECISION LENS MOUNTING

FIELD OF THE INVENTION

The present invention relates to mounting devices for optical elements and, more particularly, to mounting such elements together into a unitary assembly.

BACKGROUND OF THE INVENTION

Optical designers are called upon to develop ever more accurate and powerful lens systems for such applications as photolithography equipment for the manufacture of semiconductor products. These lens systems are expected to maintain an extremely high level of performance under a multitude of environmental conditions during use, storage and shipping. In addition, they must be easily, rapidly and accurately assembled. The problem, therefore, is not only to develop the proper optical design but also to mount the lenses into a final assembly which remains true to the original design and is inexpensively accomplished.

Lenses are commonly affixed within a lens cell which serves as an annular support for the lens. Typically, most lenses are held in lens cells with such mechanical devices as clips, clamps, screw-threaded retaining ring, epoxy, rolled lips or screws. The effects of thermal expansion and contraction when such a device is subjected to environmental temperature changes inevitably cause a change in the stress on the lens, manifested either as an unsymmetrical change of the clamping load on the element, possibly resulting in a translation of the element in its mounting within the cell, or an undesirable strain in the glass of the lens resulting in distortion of the transmitted wavefront.

The lenses must, in turn, be assembled together so as to constitute a unitary optical assembly. Such an assembly must hold the lenses within tight tolerances so as to ensure proper axial and radial alignment, and must be easily and accurately assembled so as to reduce the manufacturing costs to a minimum.

Lens assemblies may also be assembled together within a lens barrel which is an integral mechanical structure holding a series of lenses. It is used to position the lenses axially and radially with respect to each other, and to provide a means of interfacing the lens assembly with the system of which it is a part. Lens elements are radially positioned by the inside diameter or ID of the barrel wall. The outside diameter or OD of the lens elements are ground to fit ID of the barrel wall. The axial position of the lens elements is accomplished by cutting lens seats during assembly. The lens elements can then be constrained on the seats by epoxy, retaining rings, etc.

Such barrel mounted lens assemblies have the disadvantages of being subject to thermally induced stresses to the barrel and/or lens, require specialized materials to minimize the effect of such stresses, are difficult to machine, particularly for multiple lenses, and are inherently inflexible after machining regarding adjustment of the relative location of the lens elements during assembly.

The present invention eliminates or ameliorates the foregoing disadvantages of the prior art by providing a lens mount within a lens cell manufactured of less exotic materials which is unaffected by large temperature excursions, when returned to the nominal operating temperature range, and the same lens cell which can be used to quickly, easily and accurately assemble an optical system which achieves the original optical design requirements.

SUMMARY OF THE INVENTION

In order to achieve the desired results, the present invention provides a new and improved apparatus which consists of a lens bonded in a novel lens cell. The lens cell has integral machined flexures to which the lenses are bonded.

The lens cell, with attached lens, is disposed on a vacuum chuck which is, in turn, mounted on a precision air bearing lathe spindle. The chuck seat is so machined in position to have the same radius of curvature as the lens to be seated on the chuck seat. This serves two purposes: to establish the coordinates of the cutting tool with respect to the vertex of the lens and to provide a good metal to glass seating surface so as to maintain a vacuum seal between the lens and the chuck.

A high precision total indicator reading (TIR) type gauge on the surface of the lens opposite the vacuum chuck, assuming a curved surface, can be set to a minimum TIR by appropriate manipulation of the lens on the chuck seat with a minimum chuck vacuum force applied. This puts the outer lens radius of curvature, hence the optical axis of the lens, on the spin axis of the vacuum chuck. The cell surfaces, those perpendicular to the spin axis and the outer diameter of the lens cell, can be machined precisely perpendicular and concentric, respectively, to the spindle spin axis. It is the relationship from the lens vertexes to the surfaces of the cell perpendicular to the spin axis which establishes the spacings between the lenses when the lens cell assemblies are stacked and secured to each other. Accurate alignment of the optical axes of the lenses is achieved by making the outer diameters of all the lens cells equal and concentric about the optical axes of the lenses.

The machined cells, with attached lenses, are then stacked and held in a precision vee block while tests are made to evaluate the transmitted wavefront. When the desired transmitted wavefront is achieved, through axial, radial or rotational movements of selected cells, the cells are unstacked, then sequentially bonded together to form a rigid assembly as described hereinbelow.

The first cell is positioned with two or more dowel pins projecting from its seating surface. The next cell is positioned with clearance holes around the pins. The vee block walls establish the centration of the cell, hence of the lenses. Plastic dowling cement is poured into the interface between the dowel and the cell with a seal between cells to prevent the cement from leaking and contacting the cell below. This is done one at a time until the entire assembly is epoxy-pinned together. Thus is formed a rigid, accurately positioned final lens assembly.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other assemblies for carrying out the several purposes of the invention. It is important, therefore, that the claims be regarded as including such equivalent assemblies as do not depart from the spirit and scope of the invention.

Several embodiments of the invention have been chosen for purposes of illustration and description, and are shown in the accompanying drawings, forming a part of the specification.

BRIEF DESCRIPTION OF THE DRAWING

FIG. 8 shows, schematically, an apparatus useful in aligning the lens cell surfaces to the lens;

FIG. 9 shows, schematically, the apparatus of FIG. 8 after the alignment of lens to lens cell is complete;

FIG. 10 shows a lens assembly;

DETAILED DESCRIPTION OF THE INVENTION

Figure 1:
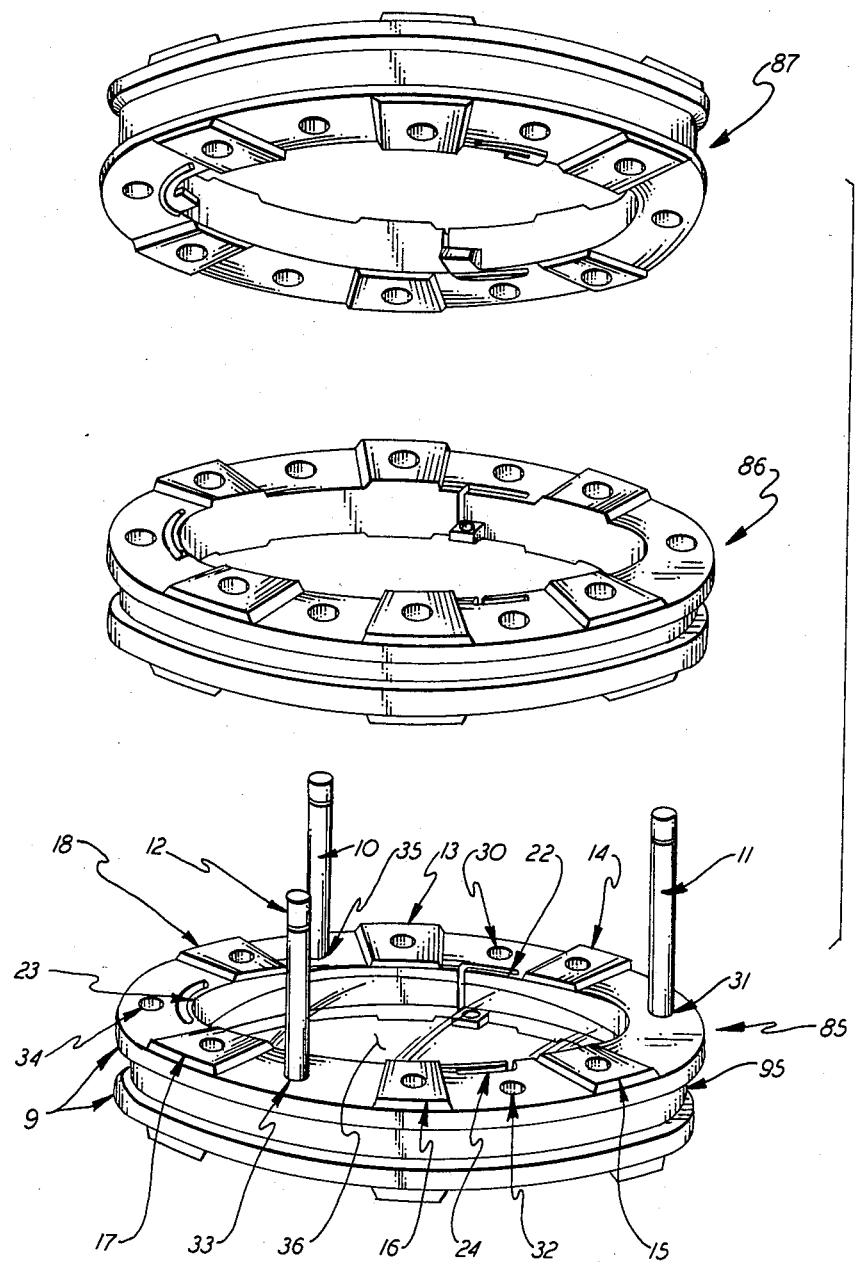
FIG. 1 shows an exploded view of a group of lens cells constructed in accordance with the present invention.

FIG. 1 is an exploded view of a group of lens cells, 85, 86 and 87 constructed in accordance with the present invention. The individual lens cells, for example 85, are generally annular rings within which an optical element, for example, a lens 36, is disposed.

It is a characteristic of any solid material that it undergoes dimensional changes as the ambient temperature changes. Some materials undergo greater dimensional changes than others in response to temperature changes, that is, they have a different coefficient of thermal expansion. Any material, bonded to a material with a differing coefficient of expansion, will experience stress at the point of bonding during temperature excursions. Such stresses can cause permanent distortion or dimensional changes to the materials and can cause a change of the orientation of one material to the other. Such dimensional or orientation changes can be disastrous in optical systems where optic spacing, centration and wedge must be held to close tolerances.

In the embodiment of the invention shown in FIG. 1, three cantilevered flexures 22, 23 and 24 are provided, to which the lens 36 is bonded. The construction and use of the flexures 22, 23 and 24 are explained hereinbelow in reference to FIGS. 2–5.

The lens cell 85 also has precision machined surfaces 13–18 on its top. The machined surfaces are so located that they match precision machined surfaces on the bottom of lens cell 86. It should be understood that while six precision machined surfaces 13–18 are shown in FIG. 1, there may be any number in excess of three. In this way cells can be rotated with respect to each other through small angles, such as 60° in the case where six precision machined surfaces are provided. By rotating select cells with respect to each other, the wavefront emanating from a series of lenses constrained within cells can be selectively changed. The method whereby a wavefront is adjusted is more fully explained in reference to FIGS. 10 and 11.

As described hereinbelow in reference to FIGS. 8 and 9, the precision machined surfaces 13–18 are in a plane which is perpendicular to the optical axis of the lens 36 contained in the cell 85. In addition, the distance from that plane to the vertex of the lens 36 is known. In this manner the vertices of lenses in adjoining cells can be established during precision machining of the lens cells.

The outer diameter 9 of the lens cell 85 is also precision machined with respect to the lens 36 contained therein. The outer diameter 9 is symmetrical about the optical axis of the lens 36. In addition, the outer diameter 9 of lens cell 85 is equal to that of all the other lens cells in an assembly. Thus, when the outer diameters of all lens cells in an assembly are co-cylindrical, the optical axes of all the lenses contained within the lens cells in such an assembly are co-axial. The apparatus and method to achieve such symmetry is explained more fully below in reference to FIGS. 8 and 9. Circumferential channel 95 is useful with the apparatus shown hereinbelow in FIG. 16 to provide for translational movements of one cell with respect to the other cells during the stacking of cells into a lens assembly.

Holes 30–35 and dowels 10–12 are used in an epoxy pinning technique to bond cells 85, 86 and 87 together into a unitary, rigid assembly of cells. As shown in FIG. 1, holes 31, 33 and 35 are adapted to hold dowels 10–12. This can be done, for example, by providing external threads on the dowels 10–12 which are threaded into tapped holes 31, 33 and 35. Bores through cells 86 and 87 are located so as to receive the dowels 10–12 extending from the top surface of cell 85 when cells 86 and 87 are stacked on cell 85. Epoxy, not shown, is then disposed between the dowels 10–12 and the corresponding bores in cells 86 and 87 to complete the epoxy bonding of cells 85, 86 and 87. This technique is more fully described hereinbelow in reference to FIG. 10.

Figure 2A:
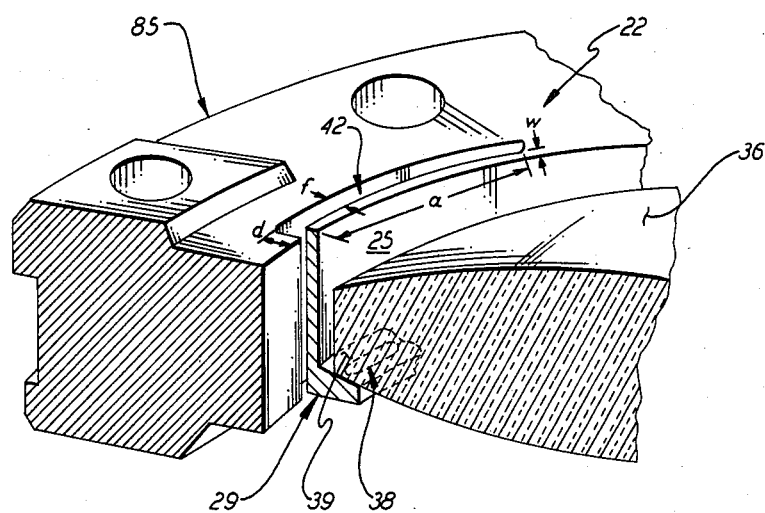
FIG. 2A shows, schematically, an embodiment of a flexure constructed in accordance with the present invention.

FIG. 2A shows an embodiment of a flexure in accordance with the present invention.

The flexure 22 is integral with the inner wall of the lens cell 85. Extending radially inward from the flexure 22, and attached thereto, is the lens seat 29. The lens seat 29 has a trough 38 formed therein which serves as a receptacle for the adhesive as described hereinbelow in reference to FIG. 3 and establishes a specific bondline thickness.

The flexure 22 is formed by, for example, wire electron discharge machining or milling a slot 42 into the wall of the lens cell 85. Such a slot 42 is radially located at a depth 'd' in the inner wall of the lens cell 85. The slot 42 begins at one end of the lens seat 29 and describes an arc of length 'a' about the center of the lens cell 85. The width of the finished flexure 22 is 'w' as shown.

Figure 2B:
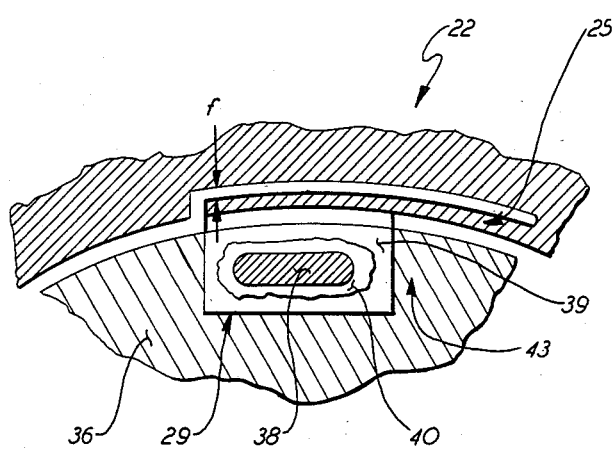
FIG. 2B is a top view of the flexure of FIG. 2.

FIG. 2B shows the manner in which the lens 36 is bonded to the flexure 22. Adhesive, such as EC 1838, available from the 3M Corporation, is placed in the trough so as to bond the lens 36 to the lens seat 29. The trough is sized to establish a bondline of cement which will withstand the stresses imparted to it during temperature excursions as described hereinbelow. There adhesive is placed in the trough 38 such that when the lens 36 is bonded to the seat 29 the excess adhesive does not overflow the seat 29 and create a fillet. It should be noted that the radius of curvature of the seat surface 39 may match the curvature of the lens 36 to which it is bonded. For large radii lenses the match between the radius of curvature of the lens 36 and the seat surface 39 diminishes in importance and can be machined at an angle with the center of the bondline forming a tangent to the lens curvature.

The lens 36 is bonded to the lens cell 85 in the following manner. Adhesive 40 is placed in the trough 38 of the seat 29. This process is carried out for each of the flexures 22, 23 and 24 of FIG. 1. The lens 36 is then placed into the lens cell and pressed down onto the lens seat 29 such that the excess adhesive 40 is extruded from the trough 38 radially outward between the lens 36 and the seat surface 39. The lens 36 is centered in any convenient manner such that the outside diameter of the lens 36 is substantially concentric with the inside diameter of the lens cell 85. This assembly is performed at an ambient datum temperature, preferably the temperature at which the assembly will be operating.

Referring now to FIGS. 2A and 2B, the operation of the flexure 22 can now be explained. As the ambient temperature cycles up or down, the relative diameter of the lens cell 85 and the diameter of the lens 36 changes. For example, consider the case where the coefficient of expansion of the lens cell 85 is considerably greater than that for the lens 36. As the temperature increases from the datum temperature, the lens cell 85 expands and the inner diameter of the lens cell 85 becomes larger. At the same time the lens 36, hence its outside diameter, becomes larger but not to the same degree as the lens cell 85. In the prior art configuration, wherein no flexures are present, the lens would move relative to the lens seat causing the adhesive bond to shift or break due to the imposed stresses. In the embodiment of the present invention as shown in FIGS. 2A and 2B, the lens seat 29 remains substantially fixed with respect to the lens 36. As the inner diameter of the lens cell 85 expands away from the lens 36, the arm 25 of the flexure 22 flexes. That is, the arm 25 moves such that the flexure slot width, f, increases. When the temperature decreases and stabilizes at the datum temperature the flexure 22 returns to its original configuration and the lens 36 is retained in its original position, centered within the lens cell 22. At no time does the flexure arm 25, lens 36 or adhesive layer 40 reach the allowable stress limits of their respective materials.

Conversely, as the ambient temperature falls below the datum temperature the diameter of the lens cell 85 contracts, the lens 36 also contracts but to a lesser degree than the lens cell 85. Consequently the flexure arm flexes 25 such that the flexure slot width, f, decreases. As in the case of increasing temperature the lens seat 29 retains its spatial orientation with respect to the lens 36 and the integrity of the adhesive layer 40 is retained. In this way, when the temperature returns to the datum temperature the lens 36 is in the same orientation with respect to the lens cell 85 as when it was fabricated.

As the flexure moves, a small torsional stress is imparted to the adhesive layer 40 as shown by the arrow 43. The adhesive layer 40 has a large enough area so that it is not deformed or broken by this stress. In addition, the shape and location of the adhesive layer 40 will not cause a distortion of the transmitted wavefront in the vicinity of the bondline.

Figure 3:
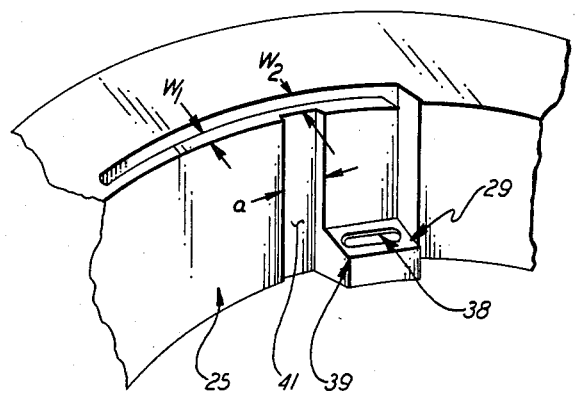
FIG. 3 is another form of the flexure of FIG. 2.

FIG. 3 shows another form of the flexure of FIGS. 2A and 2B. In the form of FIG. 3 the flexure arm 25 is of two widths, $W_1$ and $W_2$. $W_1$ is the width of the flexure arm 25 formed in the manner described in reference to FIG. 2A. $W_2$, however, is a narrower width than $W_1$ and is formed by, for example, machining down the narrow section 41 of the flexure arm 25. The narrow section 41 of the flexure arm 25 extends from the edge of the lens seat 29 a distance 'a', along the length of the flexure arm 25. The purpose of the narrow section 41 is to further reduce the stress experienced by the adhesive layer 40 shown in FIG. 2B. As the lens cell 22 expands relative to the lens 36 the flexure arm 25 flexes and a slight torsional stress is introduced to the adhesive layer 40 at the lens seat 39. This stress is as shown by the arrow 43 in FIG. 2B. The narrow section 41 of the flexure arm 25 of FIG. 3 reduces the torsional stress by allowing the section of the flexure arm containing the lens seat 29 to rotate relative to the rest of the flexure arm 25, thus substantially maintaining the orientation of the lens 36 to the seat surface 39 while maintaining the stiffness of the flexure arm 25 in the axial direction.

Figure 4:
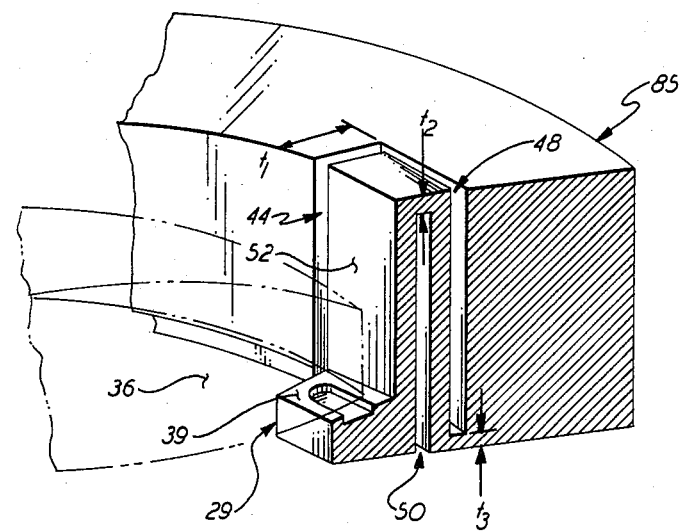
FIG. 4 is another embodiment of a flexure constructed in accordance with the present invention.

Another form of the flexure is shown in cross-section in FIG. 4. The flexure 52 is fabricated by machining, for example, radial slots, on either side of the lens seat 29, a distance $t_1$ into the wall of the lens cell 85. One such radial slot is shown at 44. Two axial slots, 48 and 50, are then formed. One axial slot, 50, is formed midway between the inner diameter of the lens cell 85 and the end of radial slot 44. It begins at the bottom of the lens cell 85, runs parallel to the inner diameter of the lens cell 85, and extends to within a distance $t_2$ of the top of the lens cell. The second axial slot is parallel to the first, begins at the end of radial slot 44 and at the top of the lens cell and extends to within the distance $t_3$ of the bottom of the lens cell.

The operation of the flexure 52 of FIG. 4 is equivalent to that described for the flexure 22 of FIGS. 2A and 2B. As the ambient temperature changes, the flexure 52 moves in or out relative to the lens cell 20 to compensate for different thermal growth rates of the lens 36 and lens cell 20. In this way there is no change in the orientation of the lens 36 to the lens seat surface 39 when the lens cell/lens assembly returns to a predetermined datum temperature following temperature excursions.

Figure 5A:
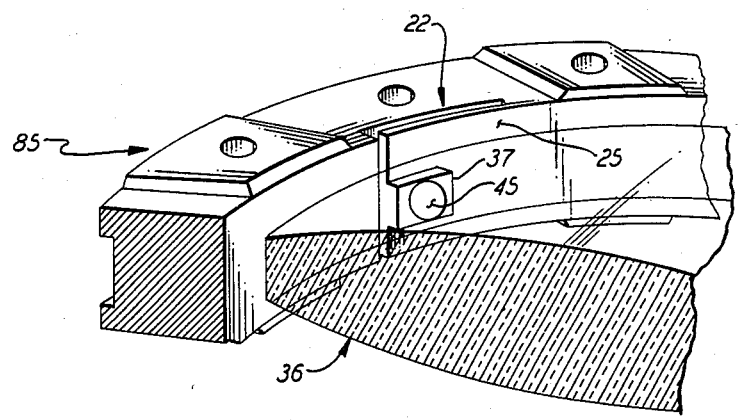
FIG. 5A is another embodiment of flexure constructed in accordance with the present invention.
Figure 5B:
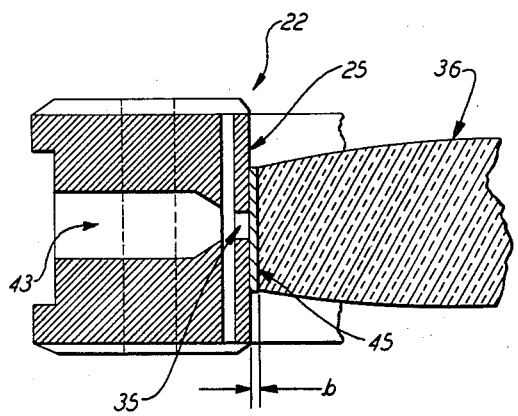
FIG. 5B is a cross-sectional view of the flexure of FIG. 5A without a projection land.
Figure 5C:
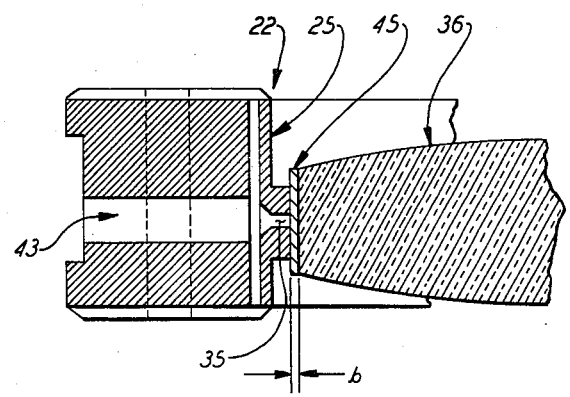
FIG. 5C is a cross-sectional view of the flexure of FIG. 5A with a projection land.

Another form of the flexure 22, in accordance with the present invention, is shown in FIGS. 5A-5C. In this form a peripheral bondline 45 is formed between the flexure arm 25 and the diameter of the lens 36. A projection land 37 can be provided so as to maintain a clearance between the lens 36 and the inner diameter of the lens cell 85. FIG. 5B is a cross-section of a flexure arm 25 without the projection land shown in FIG. 5A. To bond the lens 36 to the flexure arm 25 the lens is held, in any convenient manner, adjacent to the hole 7 in the flexure arm. Injection means, not shown, are then inserted into port 43 and a thixotropic, or viscous, cement is injected through the hole 7 to form a cement bondline 45 between the lens 36 and the flexure arm 25. A similar procedure is followed in the case where a projection land 37 is provided, as shown in FIG. 5C. Thixotropic cement, injected through the hole 7, forms a bondline 45 between the projection land 37 and the lens 36. It can be understood by those skilled in the art that the thickness shown as 'b' of the bondline 45 is established by the clearance between the lens 36 and flexure arm 25 in FIG. 5B or the lens 36 and projection land 37 in FIG. 3C.

The operation of the flexures 22 of FIGS. 5B and 5C are equivalent to that described in reference to the flexure 22 of FIGS. 2A and 2B.

It should be noted that the bondline 45 in the flexures 22 of FIGS. 5B and 5C is in tension or compression during temperature excursions above or below the datum temperature respectively. This is due to the fact that as the temperature increases above the datum point, the lens cell 85 expands to a greater extent that the lens 36. As explained hereinabove in reference to FIGS. 2A and 2B the flexure arm 25 flexes to maintain the bondline 45 to the lens 36. This flexing, however, is not perfect and a small amount of tension is introduced in the bondline 45. Conversely, when the ambient temperature drops below the datum temperature, the diameter of the lens cell 85 contracts while the lens 36 also contracts, but to a lesser degree. Accordingly, a degree of compression is introduced to the cement bondline 45. In either case of increasing or decreasing temperature, the stiffness of the lens 36 to lens cell 85 is maintained in the axial direction.

Referring now to FIGS. 6-9, the apparatus and method for machining the precision surfaces and the outer diameter of the lens cell will be explained.

Figure 6:
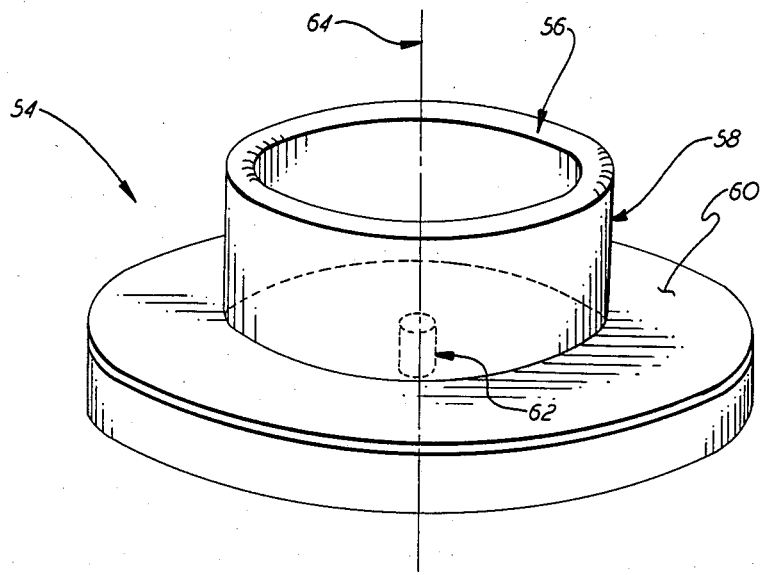
FIG. 6 is a vacuum chuck useful in fabricating a lens cell in accordance with the present invention.

FIG. 6 shows a vacuum chuck 54 useful in the present invention for holding the lens 36 and lens cell 20 while it is being machined. The machining is carried out after the lens 36 has been assembled in the lens cell 20 in the manner described hereinabove.

The vacuum chuck 54 has a base 60 which is attached to the spindle of a lathe, not shown. Preferably, the lathe spindle is supported by an air bearing. Attached to the base 60, and disposed about the spin-axis 64 of the vacuum chuck 54, is a cylindrical riser 58. At the top of the riser 58 is the chuck seat 56.

Figure 7:
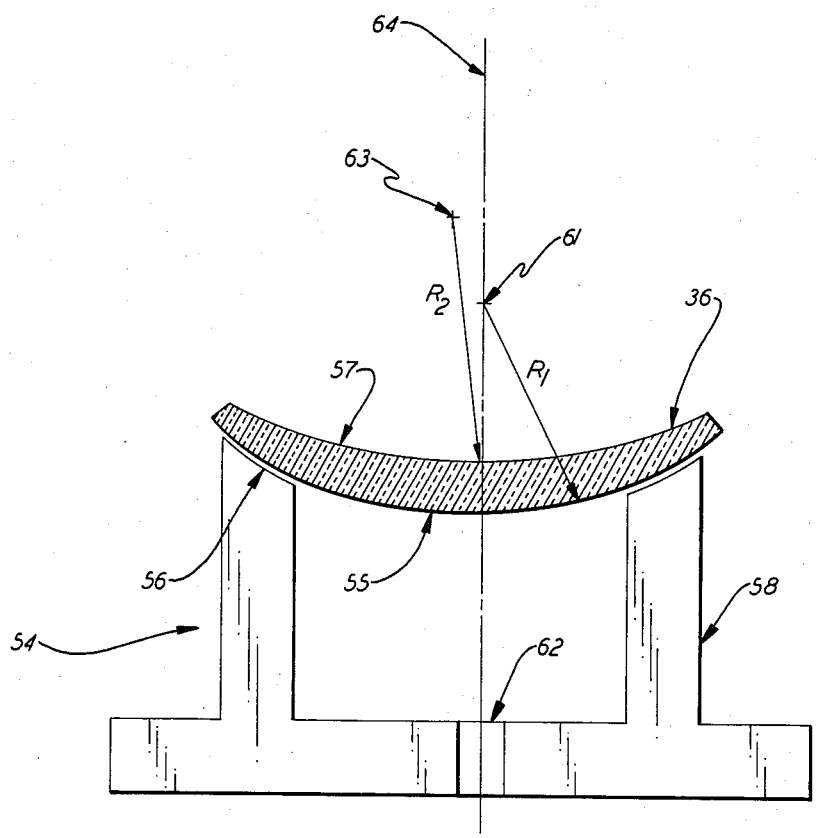
FIG. 7 shows a lens mounted on the vacuum chuck shown in FIG. 6.

FIG. 7 shows the interrelationship between a lens 36 and the vacuum chuck 54 to which it is held. For the purpose of illustration only, FIG. 7 shows the lens 36 without the lens cell to which it is attached.

The lens 36 has two surfaces, 55 and 57, each of which has a radius of curvature $R_1$ and $R_2$, respectively. So as to facilitate the seating and centering of the lens 36 onto the vacuum chuck 54, the chuck seat 56 is machined to have the same radius of curvature, $R_1$, as lens surface 55. In this way lens surface 55 of the lens 36 and the chuck seat 56 are match-mated to each other. This minimizes hertzian seating stresses on the lens 36 as well as establishing the cordinates for machining the lens cell as described hereinbelow in reference to FIG. 9.

As shown in FIG. 7, the lens 36 is not a flat. Accordingly, the center of curvature of the chuck seat 56 is machined to be on the spin axis 64 of the vacuum chuck 54. By making the lens surface 55 match-mated to the chuck seat 56, the center of curvature 61 of lens surface 55 is always on the spin axis 64 of the vacuum chuck 54. The alignment of the center of curvature 63 of lens surface 57 to the spin axis 64 is explained hereinbelow in reference to FIG. 8. If the lens 36 is a flat, the chuck seat 56 is machined perpendicular to the spin axis 64 of the vacuum chuck 54.

To retain the lens 36 and cell 20 assembly to the vacuum chuck 54 a vacuum is drawn, within the riser 58 through passage 62 by vacuum means, not shown. When a low vacuum is drawn, the lens 36 and cell 20 assembly are held to the vacuum chuck 54 but can be rotated radially relative to the vacuum chuck 54. This facilitates alignment of the optical axis of the lens 36 to the spin axis 64 of the vacuum chuck as explained hereinbelow in reference to FIG. 8. Following alignment a strong vacuum is drawn in the vacuum chuck 54 to hold the lens 36 and lens cell 20 assembly during the machining of the lens cell 20 as described hereinbelow in reference to FIG. 9.

FIG. 8 illustrates a manner in which the alignment of the optical axis 66 of the lens 36 to the spin axis 64 of the vacuum chuck 54 can be accomplished.

The chuck 54 is shown mounted to the lathe spindle 70 through the chuck base 60. As described in reference to FIG. 7, the chuck base 60 is attached to a riser 58 which terminates in a chuck seat 56 upon which the lens 36 is seated. A TIR gauge 68 is placed on the surface of the lens 36 opposite the vacuum chuck 54. If, as shown in FIG. 8, the optical axis 66 of the lens 36 is not on the spin axis 64 of the vacuum chuck 54, the meter showing the run-out detected by the gauge 68 will be other than zero. The lens 36 can then be moved relative to the chuck seat 56 until the gauge readout 69 shows a minimum acceptable run-out. This puts the optical axis of the lens 36 on the spindle spin axis 64 and thus the vacuum chuck 54 as shown in FIG. 9.

FIG. 9 also shows a tool bit 74, for example, a diamond-point tool, and a tool controller 76. It can be appreciated by those skilled in the art that with the spin axis of the chuck 64 coincident with the optical axis 66 of the lens 36, the vertex 79 of the lens 36 is on the spin axis 64 of the vacuum chuck 54. Since the radius of curvature of the lens 36 is match mated to the radius of curvature of the chuck seat 56 and the apex 79 of the lens 36 is on the spin axis 64 of the vacuum chuck 54, the position of the vertex 79 is precisely known with respect to the vacuum chuck 54. The apex 79 is taken, then, as the (0,0,0) point for the tool 74. In this way all surfaces on the cell 20 can be machined precisely with respect to the vertex 79 and optical axis 64 of the lens 36.

Referring to FIG. 1 and FIG. 9, it can be appreciated that the outer diameter of the lens cell 20 can be machined concentric about the optical axis 66 of the lens 36. Further, the precision machined surfaces 13-18 can be machined perpendicular to the optical axis of the lens 36 and located precisely with respect to the vertex 79 of the lens 36. All of the lens cells in an assembly of lens cells have their outer diameters machined to a common dimension. Thus, when the lens cells are stacked, in a manner described in reference to FIG. 10, the outer diameter of all the lens cells is made to be co-cylindrical to establish a common optical axis for the lenses in the assembly. The distance from the lens apexes to the cell surfaces perpendicular to the optical axis of the lens establishes the optical spacings when the lens cells are stacked and secured to each other.

FIG. 10 shows a lens assembly 94. The lens cells 80-92 are stacked together and the wavefront directed therethrough is adjusted in a manner described hereinbelow in reference to FIG. 11. Briefly, the optical characteristics of the wavefront can be changed by rotating, translating or axially moving selected ones of the lens cells with respect to others in the lens assembly 94. Selected ones of the lens cells can be moved axially with respect to the other lens cells in a lens assembly to correct for spherical aberrations. This can be accomplished by changing the thickness of shims 104 or through the use of the apparati shown in FIGS. 18 and 19. Coma can be corrected by translating selected ones of the lens cells with respect to the other lens cells in a lens assembly as described herein in reference to FIG. 16. Further, by rotating selected ones of the lens cells with respect to others, astigmatism can be corrected.

Figure 14:
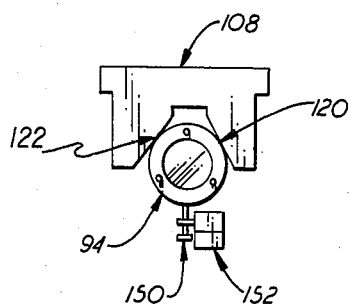
FIG. 14 shows an apparatus useful in holding the cells in a lens assembly in proper relation during epoxy pinning.
Figure 15:
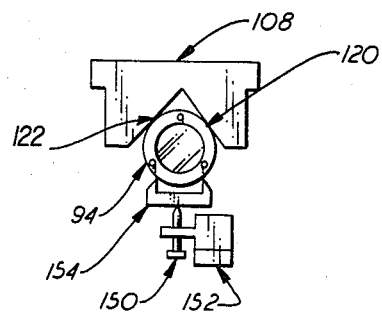
FIG. 15 shows another form of the apparatus of FIG. 14.

Thirteen cells are shown bonded together in FIG. 10 as an example. It can be appreciated, however, that the cell-to-cell alignment and bonding method described herein is applicable to any plurality of cells. The cells 80-92 are then bonded together using, for example, dowels 102, plastic adhesive 100, and inter-cell seals. FIGS. 14 and 15 show apparati useful in holding the lens cells in their desired spatial relation during the bonding process.

As can be seen in FIG. 10, the lens assembly 94 is an assembly of discrete groups, for example, 81-83, 83-85, 85-87, 87-89 and 89-91. The lens assembly 94 has a bottom lens cell 80 and a cap lens cell 92 between which are disposed the groups of lens cells. It should be understood that the groups of lens cells may consist of any desired number of lens cells in excess of two.

Each group of lens cells has an anchor lens cell, for example 85, individual lens cells or cell, for example 86, and a top lens cell, for example 87. The top lens cell in a group also serves as an anchor lens cell if another group is stacked upon it. For example, lens cell 87 serves as a top lens cell for the group 85-87 and as the anchor lens cell for the group 87-89. As described hereinabove in reference to FIG. 1, two or more dowels 102 are anchored in each anchor cell, 85 for example, and extend through the individual cell or cells and the top cell in the group.

Pins 96 and 106 are shown to be conical. The conical shape of pins 96 and 106 allows them to be removed from their respective adhesive layers while retaining proper alignment to the remainder of the cells 81-91. This allows bottom lens cell 80 and cap lens cell 92 to be easily removed should they become damaged during assembly, transport or use.

Figure 12:
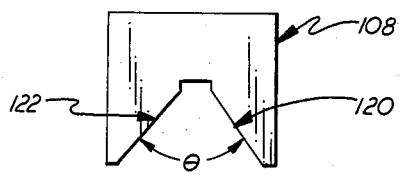
FIG. 12 shows a vee block useful in the apparatus of FIG. 11.
Figure 11:
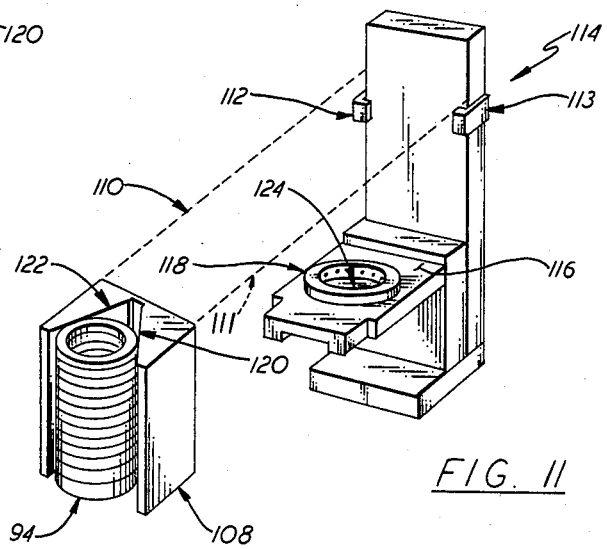
FIG. 11 shows an apparatus useful in aligning the lens assembly of FIG. 10.

FIG. 11 shows an apparatus useful in accomplishing the optical alignment of the lens assembly 94 of FIG. 10. The lens assembly 94 is placed in a precision vee block 108 which is more clearly understood by reference to FIG. 12. It is made of a dimensionally stable material, such as granite, with the two faces 120 and 122 forming an angle $\theta$ therebetween which is maintained for its entire length. The two faces, 120 and 122 of the vee block 108 are so formed that the contact between the outer diameter of each cell in the assembly 94 and the faces 120 and 122 falls on a line.

Returning now to FIG. 11, the assembly 94 is placed in contact with the two faces 120 and 122 of the vee block 108, then transported by means, not shown, to the assembly station 114 as shown by the dotted lines 110 and 111. The vee block 108 is held to the assembly station 114 by the clamps 112 and 113.

The lens assembly 94 rests on a floating mount 118 which is spaced away from the vee block 108. The floating mount 118 allows lateral translation and tilt of the lens assembly 94 with respect to the vee block faces 120 and 122 so as to ensure that the outer diameters of the lens cells in the lens assembly 94 just contact the faces 120 and 122. In this manner there is no distortion of the vee block 108 due to lens assembly 94 loading stresses and thus the optical axis of the lens assembly 94 is held parallel to the longitudinal axis of the vee block 108.

Figure 13:
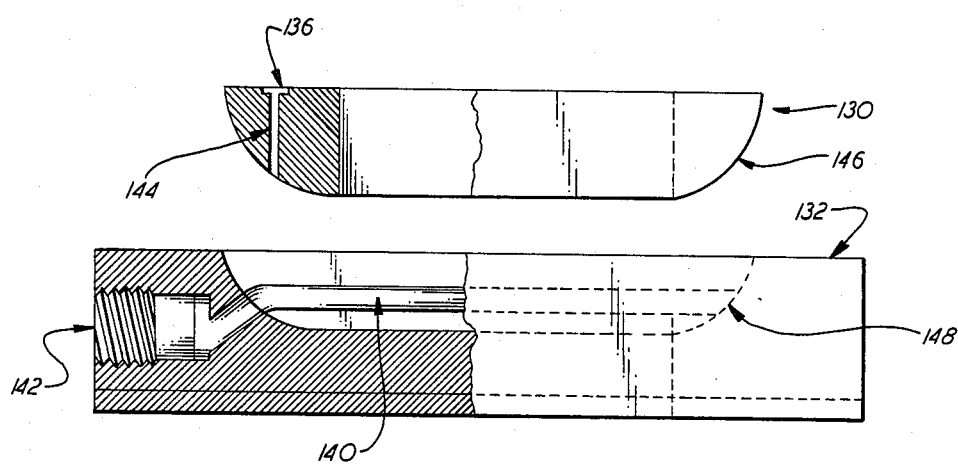
FIG. 13 shows, schematically, the floating mount useful in the apparatus of FIG. 11.

FIG. 13 shows, in a sectional view, the floating mount 118 of FIG. 11. A float 130 is supported by a base 132. Pressurized air enters passage 142 which communicates with raceway 140 machined into bearing surface 148. Bearing surface 148 is machined with the same radius of curvature as journal surface 146 on float 130. The air entering raceway 140 thus forms a layer between the journal surface 146 and bearing surface 148. There are a plurality of passageways 144 which communicate through the float to a like plurality of openings in a channel 136 formed into the top of the float 130. Some of the air entering the raceway 140 passes through the passageways 144 to the channel 136. In this way a layer of air is formed between the top of the float 130 and the bottom cell of the lens assembly, not shown, which rests on the float. Thus, the lens assembly floats on the floating mount 118 and may be frictionlessly moved laterally and tilted.

With the lens assembly 94 held in the vee block 108 as shown in FIG. 11 a wavefront, directed through it, can be inspected. A passageway is provided through the center of the floating mount 118 which is concentric about the passageway 124 provided through the base 116. In this manner, light can be directed through the lens assembly 94, floating mount 118 and base 116 to provide a passageway for light used in inspecting the lens assembly 94 during its assembly. Inspection means, not shown, can be, for example, an interferometer located substantially beneath the passageway 124 in the base 114. In this way the wavefront can be examined to be sure that it conforms to the original optical design of the lens assembly. Correction can be made when necessary by making axial, rotational or translational movements of selected lens cells by, respectively, changing the shim 104 thickness between selected ones of the cells, by rotating selected ones of the cells with respect to the others in the lens assembly 94 and using the apparati and methods described hereinbelow in reference to FIGS. 16 and 17.

As described in reference to FIG. 9, all of the cells in an assembly are machined such that the outside diameters are the same, and each cell outside diameter is concentric about the optical axis of the lens it contains. Thus, to align the optical axes of all of the lenses all that is required is to apply enough force to each lens cell to bring them just into contact with both faces 120 and 122 of the vee block.

Figure 16:
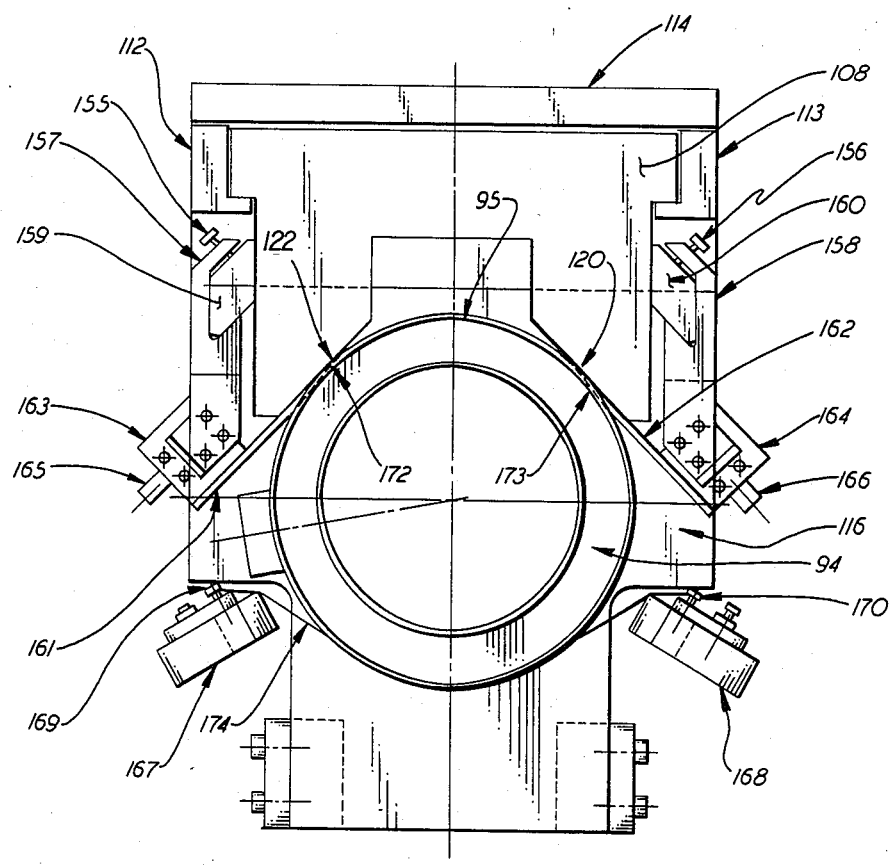
FIG. 16 shows, in top view, a manner in which translation of the individual cells in the assembly of FIG. 10 can be accomplished.

FIG. 16 shows an apparatus useful in holding lens cells in a lens assembly in their proper relation during initial aligning and testing. As shown in FIG. 10, the lens cells 8092 have circumferential channels 95 in their outer diameters. After the lens assembly 94 is assembled onto the assembly station 114, it may be necessary to translate the optical axis of one lens with respect to the others to achieve the requirements of the original optical design.

Rails 159 and 160 are extended from the base 116 of the assembly station to the top of the vee block 108. To each rail 159 and 160 is affixed a clamp support, 157 and 158 respectively. These clamp supports slide up and down the rails 159 and 160 and are held in position by knurled thumb screws 155 and 156 respectively. At the end of each clamp support 157 and 158 is a mini-translation stage 163 and 164, respectively, each of which is translatable through the use of screws 165 and 166, respectively. Attached to each minitranslation stage 163 and 164 is a bayonet 161 and 162, respectively, which is sized to engage the circumferential channels 95 of the individual cells. The tips 172 and 173 are tapered to facilitate sliding the bayonets 161 and 162 between the lens assembly 94 and vee block faces 122 and 120 respectively.

The cell translation device of FIG. 16 operates as follows: a selected lens cell is brought into contact with the two faces 122 and 120 of the vee block 108 by rubber band 174 acting in the circumferential channel 95 of the lens cell. By selectively moving screws 165 and 166 in or out, the stages 163 and 164 and bayonets 161 and 162 move between the cell and the vee block faces 122 and 120. This allows the cell to be moved away from the vee block faces 122 and 120. Since the remaining cells are still held in contact with the vee block faces 122 and 120, the optical axis of the moved cell is translated relative to the optical axes of the remaining cells. Each individual cell is held in the desired position relative to the other cells by elastic bands 174 which are held at each end thereof by screws 169 and 170 affixed to blocks 167 and 168, respectively. The blocks 167 and 168 are attached to the assembly station 114.

Figure 17:
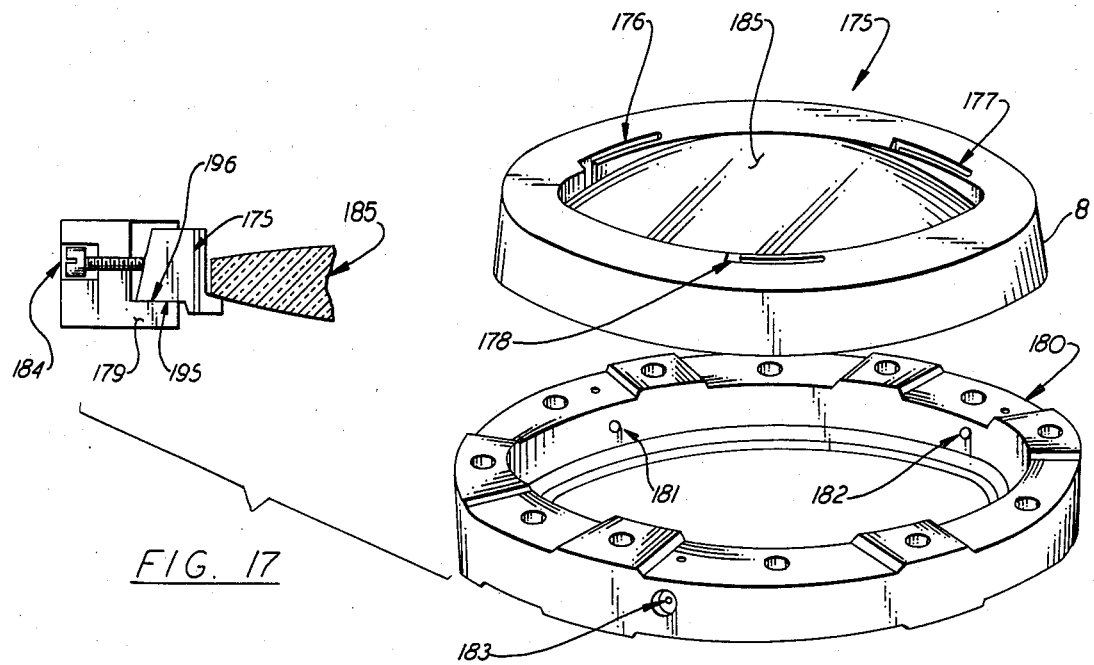
FIG. 17 shows, schematically, a manner in which translation of the individual cells in the assembly of FIG. 10 can be accomplished.

An alternate lens translation technique is shown in FIG. 17 wherein a lens cell insert 175, having a tapered outside diameter 8, fits within a lens cell 180. The lens cell insert 175 has a lens 185 mounted through three flexures 176, 177 and 178 within it in the manner described hereinabove. Translation is accomplished by screws 184 acting through three holes 181, 182 and 183 to move the lens cell insert 175, hence the lens 185, in any desired direction. In this way the optical axis of the lens 185 can be moved relative to the optical axis of the other lenses in a lens assembly of which it is a part. The tapered outside diameter 8 of the lens cell insert 175 assures a downward force on the lens cell insert 175 which precludes introducing a tilt to the lens 185 during translation. Extending radially inward from lens cell 180 is lip 179. The top surface of lip 179 has a precision machined surface 195 which matches the precision machined surface 196 on the bottom of lens cell insert 175. The precision machined surfaces 195 and 196 establish the axial spacing of the lens cell insert 175, hence of the lens 185, with respect to the lens cell 180 and with respect to lens cells above or below lens cell 180 in a lens assembly.

Figure 18:
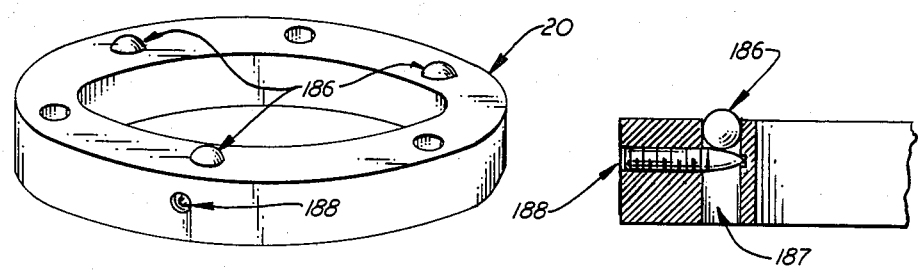
FIG. 18 shows, schematically, a manner in which axial movement of the cells with respect to one another can be accomplished.
Figure 19:
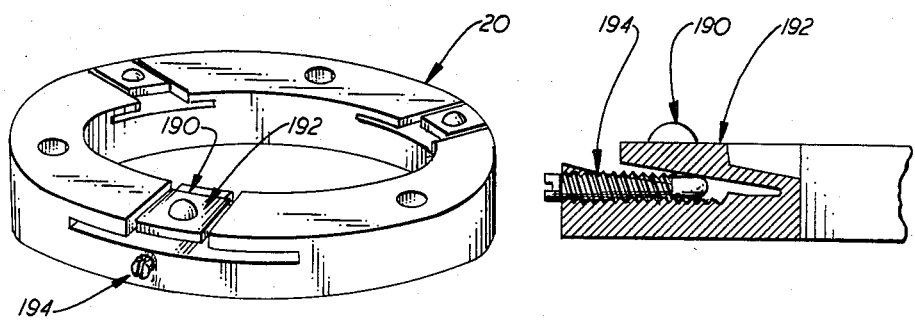
FIG. 19 shows, schematically, a manner in which axial movement of the cells with respect to one another can be accomplished.

An alternate technique to move individual cells axially with respect to each other is as shown in FIGS. 18 and 19.

FIG. 18 shows a ball 186 disposed in a hole 187 in the top of a lens cell 20. The ball 186 is forced up when a tapered screw 188 is forced against it. A second lens cell, not shown, directly above the lens cell 20 will be forced upward when the ball 186 is so moved. Three such ball 186 and screw 188 arrangements are disposed at 120° intervals about the top of the lens cell 20.

FIG. 19 shows a half ball 190 disposed on a tapered cantilevered arm 192. As screw 194 is moved into the lens cell 20 it forces the tapered cantilevered arm 192 and ball 190 upward. A second lens cell, not shown, directly above the lens cell 20 will be forced upward when the ball 190 is so moved. Three such ball 190, arm 192 and screw 194 arrangements are disposed at 120° intervals about the top of the lens cell 20.

The apparatus shown in FIGS. 18 and 19 for affecting axial movements of a lens cell can be used to tilt one lens cell, hence one lens, with respect to the others in an assembly. This is accomplished by moving the ball 186 of FIG. 18 or the ball 190 of FIG. 19 more or less than the other two balls in the apparatus.

When the lens assembly 94 is properly adjusted so as to provide the desired wavefront, the lens cells in the lens assembly 94 are epoxied together so as to form a unitary structure. It should be noted that the lens assembly can, at this point, be unstacked, then built up again, cell by cell, to facilitate the epoxying process. This unstacking and building up is done while retaining the as-adjusted wavefront. Referring to FIG. 10 it can be seen that the epoxying process is accomplished by injecting plastic dowling cement 100, such as, for example, EPON 828, into the interface between the dowel 102 and the cell. A seal 98, between cells, prevents the cement 100 from leaking and contacting the cell below. The dowels 102 are anchored in one cell, such as cell 85, by, for example, screwing the dowel 102 into a tapped hole in the cell 85. The dowel then extends through holes in one or more cells, 86 and 87, above the anchor cell 85. It should be noted that the holes in the cells 86 and 87 are roughly aligned to the dowels 102 prior to the fine alignment of the assembly 94 as described in reference to FIG. 11. By doweling 3 to 5 cells together in the above-described manner, the lens assembly 94 can be assembled in a plurality of groups such as the group exemplified by cells 85-87. It can be understood by those skilled in the art that two or more continuous dowels, extending through all the cells 80-92, can be employed as an alternate to the above-described method.

FIG. 14 shows an apparatus useful in holding the cells in a lens assembly in fixed spatial relation to one another during plastic doweling assembly. A lens assembly 94 is shown in contact with the two faces 122 and 120 of the vee block 108. The spring loaded screw 150 contacts the individual cells in the lens assembly 94 by being moved relative to a screw block 152 which is fixed to the assembly station 114 of FIG. 11. In this way the unsymmetrical forces generated during cement curing, which tend to decenter the lens axis from the vee block axis, are overcome.

FIG. 15 illustrates an improvement to the device of FIG. 14 wherein a fork 154 is attached to the tip of the screw so that the force is more evenly distributed to the lens assembly 94.

There has thus been described a mounting device for optical elements which mounts such elements together in a unitary assembly. Such assembly is unaffected by large temperature excursions and is quickly, easily and accurately assembled.

While the present invention has been shown and described with reference to a preferred embodiment thereof, it will be understood by those skilled in the art that changes in form or details may be made therein without departure from the scope and intent of the invention. Accordingly, it is understood that the invention is to be broadly construed within the spirit and scope of the claims appended hereto.

What is claimed is:

1. A precision lens mounting assembly comprising:
   a plurality of lens cells;
   a plurality of lenses corresponding to said plurality of lens cells;
   said lens cells each having an inner diameter, an outer diameter, a top surface and a bottom surface;
   flexure means disposed within the inner diameter of each of said plurality of lens cells to hold an individual lens in a predetermined spatial relation at a datum temperature to said inner diameter, said top surface and said bottom surface;
   said flexure means returning said individual lens to said predetermined spatial relation following temperature excursions away from then back to said datum temperature;
   the outer diameter of said plurality of lens cells being substantially equal to each other and substantially concentric about the optical axis of their respective individual lenses;
   the upper and lower surfaces of each lens cell having three or more precision surfaces disposed on a plane substantially perpendicular to the optical axis of said individual lens, said plane having a predetermined spatial relation to the vertex of said individual lens; and
   said plurality of lens cells forming a stack of lens cells substantially in contact at said precision surfaces.

2. A precision lens mounting assembly as claimed in claim 1 wherein said stack of lens cells comprises:
   a bottom lens cell;
   a cap lens cell; and
   one or more groups of lens cells disposed between said bottom and said cap lens cells.

3. A precision lens mounting assembly as claimed in claim 2 which further comprises holding means to hold said stack of lens cells substantially in contact at said precision surfaces.

4. A precision lens mounting assembly as claimed in claim 3 wherein said holding means comprises:
   one or more groups of lens cells comprising an anchor lens cell, one or more individual lens cells and a top lens cell;
   at least two dowels fixed to the top surface of said anchor lens cell;
   said one or more individual lens cell having bores therethrough for receiving said dowels;
   said top lens cell having bores therethrough for receiving said dowels;
   said top lens cell having at least two dowels fixed to the top surface thereof to fix the next group of individual lens cells thereto;

5. A precision lens mounting assembly as claimed in claim 4 which further includes:
   a bottom anchor cell in said stack of lens cells having at least two bottom conical dowels fixed to the bottom surface thereof;
   said bottom lens cell having bores therethrough for receiving said bottom conical dowels;
   a top group of lens cells wherein the top lens cell in said top group of lens cells has at least two top conical dowels fixed to the top surface thereof;
   said cap lens cell having bores therethrough for receiving said top conical dowels;
   said top and bottom conical dowels having an outside diameter smaller than the inside diameter of the bores;
   epoxy disposed between said top and bottom conical dowels and the bores through said cap lens cell and said bottom lens cell, respectively; and
   seals to prevent said epoxy from escaping from the bores.

6. A precision lens mounting assembly as claimed in claim 1 which further includes:
   spacing adjustment means to adjust the axial spacing between selected ones of said lens cells.

7. A precision lens mounting assembly as claimed in claim 6 wherein said spacing adjusting means comprises a shim, said shim having a top precision surface substantially in contact with the precision surfaces on the bottom surface of a first selected one of said lens cells and a bottom precision surface substantially in contact with the precision surfaces on the top surface of a second selected one of said lens cells.

8. A precision lens mounting assembly as claimed in claim 6 wherein said spacing adjusting means comprises:
   at least three threaded holes extending radially inward from the outer diameter of selected ones of said lens cells;
   at least three tapered screws extending into the threaded holes;
   axial moving means disposed on the upper surface of said selected ones of said lens cells; and
   said tapered screws being radially translatable within the threaded holes to encounter said axial moving means, said axial moving means moving axially when said tapered screws are moved inwardly radially.

9. A precision lens mounting assembly as claimed in claim 8 wherein said axial moving means comprises:
   at least three balls corresponding to at least three through bores, each ball being disposed in a through bore, each through bore intersecting each threaded hole; and
   said balls resting on said tapered screws 10. A precision lens mounting assembly as claimed in claim 8 wherein said axial moving means comprises:
    tapered cantilevered beams each having a top surface, a bottom tapered surface, a free end and a fixed end;
    the top surface of each tapered cantilevered beam being substantially flush with the upper surface of each lens cell;
    the bottom tapered surface of said tapered cantilevered beam contacting tapered screw extending radially inwardly from the threaded hole;
    the fixed end of the tapered cantilevered beam being substantially at the inner diameter of said lens cell;
    said tapered cantilevered beam extending radially outwardly from said inner diameter of said lens cell; and
    a half ball, said half ball being disposed on the top surface of said tapered cantilevered beam.

11. A precision lens mounting assembly as claimed in claim 1 wherein said flexure means comprises:

at least three arcuate cantilevered arms integrally formed in said lens cells, each arm having a free end and a fixed end, the outer walls of said arms being substantially flush with said inner diameter; and each of said arcuate cantilevered arms having lens seats distal said fixed end to support said individual lens in respective lens cells.

12. A precision lens mounting assembly as claimed in claim 1 which further includes:

said lens seat extending radially inwardly from said lens cell inner diameter;

said lens seat having a trough therein; and adhesive disposed in said trough to adheringly hold said individual lens.

13. A precision lens mounting assembly as claimed in claim 11 wherein said arcuate cantilevered arms each have a narrow section extending from said lens seat towards said fixed end for a short distance.

14. A precision lens mounting assembly as claimed in claim 13 which further includes:

said lens seat extending radially inwardly from said lens cell inner diameter;

said lens seat having a trough therein; and adhesive disposed in said trough to adheringly hold said individual lens.

15. A precision lens mounting assembly, as claimed in claim 1 wherein said flexure means comprises:

an articulated flexure integrally formed in each of said lens cells;

said articulated flexure comprising a first arm located radially inwardly from said inner diameter of the lens cell joined at said bottom surface of the lens cell, said first arm extending axially to a joint at substantially said top surface;

a second arm having an outer wall flush with said inner diameter, extending axially from said joint to substantially said bottom surface; and a lens seat extending radially inwardly from said second arm distal said joint to support said individual lens in its respective lens cell.

16. A precision lens mounting assembly as claimed in claim 15 which further includes:

said lens seat having a trough therein; and adhesive disposed in said trough to adheringly hold said individual lens.

17. A precision lens mounting assembly as claimed in claim 1 wherein said flexure means comprises:

at least three arcuate cantilevered arms integrally formed in said lens cells, each arm having a free end and a fixed end, the outer walls of said arms being substantially flush with said inner diameter;

each of said arcuate cantilevered arms having a hole therethrough distal said fixed end;

said lens cell having radial ports therethrough corresponding to the holes in each of said arcuate cantilevered arms;

adhesive disposed between said arcuate cantilevered arms and the circumference of said individual lens to adheringly hold said individual lens; and said adhesive being disposed substantially at the holes in said arcuate cantilevered arms.

18. A precision lens mounting assembly as claimed in claim 17 which further comprises:

said arcuate cantilevered arm having a projection land integral therewith;

said projection land projecting radially inwardly from said arcuate cantilevered arm distal said fixed end;

the hole extending through said projection land; and said adhesive being disposed between said projection land and said lens.

19. A precision lens mounting apparatus comprising:

a lens cell insert having an inner diameter, a tapered outer diameter, a top surface and a precision machined bottom surface;

a lens;

flexure means disposed within the inner diameter of said lens cell insert to hold said lens in a predetermined spatial relation, at a datum temperature, to said inner diameter, said top surface and said bottom surface; and said flexure means returning said lens to said predetermined spatial relation following temperature excursions away from, then back to, said datum temperature;

a lens cell having an inner diameter, an outer diameter, a top and a bottom surface;

said lens cell having at least three threaded holes extending from said outer to said inner surface;

three screws corresponding to the three threaded holes in said lens cell;

a precision machined surface extending radially inward from the inner diameter of said lens cell;

the tapered outer diameter of said lens cell insert being less than the inner diameter of said lens cell;

said precision machined bottom surface of said lens cell insert resting on said precision machined surface of said lens cell.

20. A precision lens mounting apparatus comprising:

a lens cell having an inner diameter, an outer diameter, a top surface and a bottom surface;

a lens;

flexure means disposed within the inner diameter of said lens cell to hold said lens in a predetermined spatial relation, at a datum temperature, to said inner diameter, said top surface and said bottom surface; and said flexure means returning said lens to said predetermined spatial relation following temperature excursions away from, then back to, said datum temperature.

21. A precision lens mounting apparatus as claimed in claim 20 wherein said flexure means comprises:

at least three arcuate cantilevered arms integrally formed in said lens cell, each arm having a free end and a fixed end, the outer walls of said arms being substantially flush with said inner diameter; and each of said arcuate cantilevered arms having lens seats distal said fixed end for securing said individual lens to respective lens cells.

22. A precision lens mounting apparatus as claimed in claim 21 which further includes:

said lens seat extending radially inwardly from said lens cell inner diameter;

said lens seat having a trough therein; and adhesive disposed in said trough to adheringly hold said individual lens.

23. A precision lens mounting apparatus as claimed in claim 22 wherein said arcuate cantilevered arms each have a narrow section extending from said lens seat towards said fixed end for a short distance.

24. A precision lens mounting apparatus as claimed in claim 22 wherein said flexure means comprises:

an articulated flexure integrally formed in said lens cell;

said articulated flexure comprising a first arm located radially inwardly from said inner diameter of the lens cell joined at said bottom surface of the lens cell, said first arm extending axially to a joint at substantially said top surface;

a second arm having an outer wall flush with said inner diameter, extending axially from said joint to substantially said bottom surface; and a lens seat extending radially inwardly from said second arm distal said joint for securing said lens to said lens cell.

25. A precision lens mounting apparatus as claimed in claim 24 which further comprises:

said lens seat having a trough therein; and adhesive disposed in said trough to adheringly hold said individual lens.

26. A precision lens mounting assembly as claimed in claim 20 wherein said flexure means comprises:

at least three arcuate cantilevered arms integrally formed in said lens cell, each arm having a free end and a fixed end, the outer walls of said arms being substantially flush with said inner diameter;

each of said arcuate cantilevered arms having a hole therethrough distal said fixed end;

said lens cell having radial ports therethrough corresponding to the holes in each of said arcuate cantilevered arms;

adhesive disposed between said arcuate cantilevered arms and the circumference of said lens to adheringly hold said lens; and said adhesive being disposed substantially at the holes in said arcuate cantilevered arms.

27. A precision lens mounting assembly as claimed in claim 26 which further comprises:

said arcuate cantilevered arm having a projection land integral therewith;

said projection land projecting radially inwardly from said arcuate cantilevered arm distal said fixed end;

the hole extending through said projection land; and said adhesive being disposed between said projection land and said lens.

* * * * *